United States Patent
Helfenstein et al.

(10) Patent No.: US 6,593,828 B1
(45) Date of Patent: Jul. 15, 2003

(54) SYSTEM AND METHOD FOR FILTER TUNING

(75) Inventors: Markus Helfenstein, New York, NY (US); Drahoslav Lim, San Diego, CA (US); George S. Moschytz, Zurich (CH)

(73) Assignee: GlobespanVirata, Inc., Red Bank, NJ (US)

( * ) Notice: Subject to any disclaimer, the term of this patent is extended or adjusted under 35 U.S.C. 154(b) by 81 days.

(21) Appl. No.: 09/862,919

(22) Filed: May 22, 2001

Related U.S. Application Data
(60) Provisional application No. 60/206,165, filed on May 22, 2000.

(51) Int. Cl.[7] .............................................. H03H 11/08
(52) U.S. Cl. ...................................... 333/17.1; 333/174
(58) Field of Search ............................... 333/17.1, 176, 333/174, 202, 205, 207, 215, 234, 235

(56) References Cited

U.S. PATENT DOCUMENTS

| | | | | | |
|---|---|---|---|---|---|
| 5,019,792 | A | * | 5/1991 | DiBiase et al. ............ 333/17.1 |
| 5,084,684 | A | * | 1/1992 | Shimizu et al. ............. 333/204 |
| 5,422,610 | A | * | 6/1995 | Heine et al. ................. 333/134 |
| 5,473,292 | A | * | 12/1995 | Victorin ..................... 333/17.1 |
| 5,550,520 | A | * | 8/1996 | Kobayashi .................. 333/213 |
| 5,638,034 | A | * | 6/1997 | Heikkila et al. ........... 333/17.1 |
| 5,752,179 | A | * | 5/1998 | Dobrovolny ................ 333/174 |

* cited by examiner

*Primary Examiner*—Seungsook Ham
(74) *Attorney, Agent, or Firm*—Thomas, Kayden, Horstemeyer & Risley

(57) ABSTRACT

A system and method for filter tuning are presented. The system comprises means for adjusting the components of a filter by coarse adjustments such that the filter is set with an initial cutoff frequency of adequate accuracy to satisfy the requirements of the filter application, and means for adjusting the components of the filter by fine adjustments such that the filter is set to maintain the accuracy of the initial cutoff frequency in response to cutoff frequency drift. The method comprises the steps of adjusting the components of a filter by coarse adjustments such that the filter is set with an initial cutoff frequency of adequate accuracy to satisfy the requirements of the filter application, and adjusting the components of the filter by fine adjustments such that the filter is set to maintain the accuracy of the initial cutoff frequency in response to cutoff frequency drift.

15 Claims, 11 Drawing Sheets

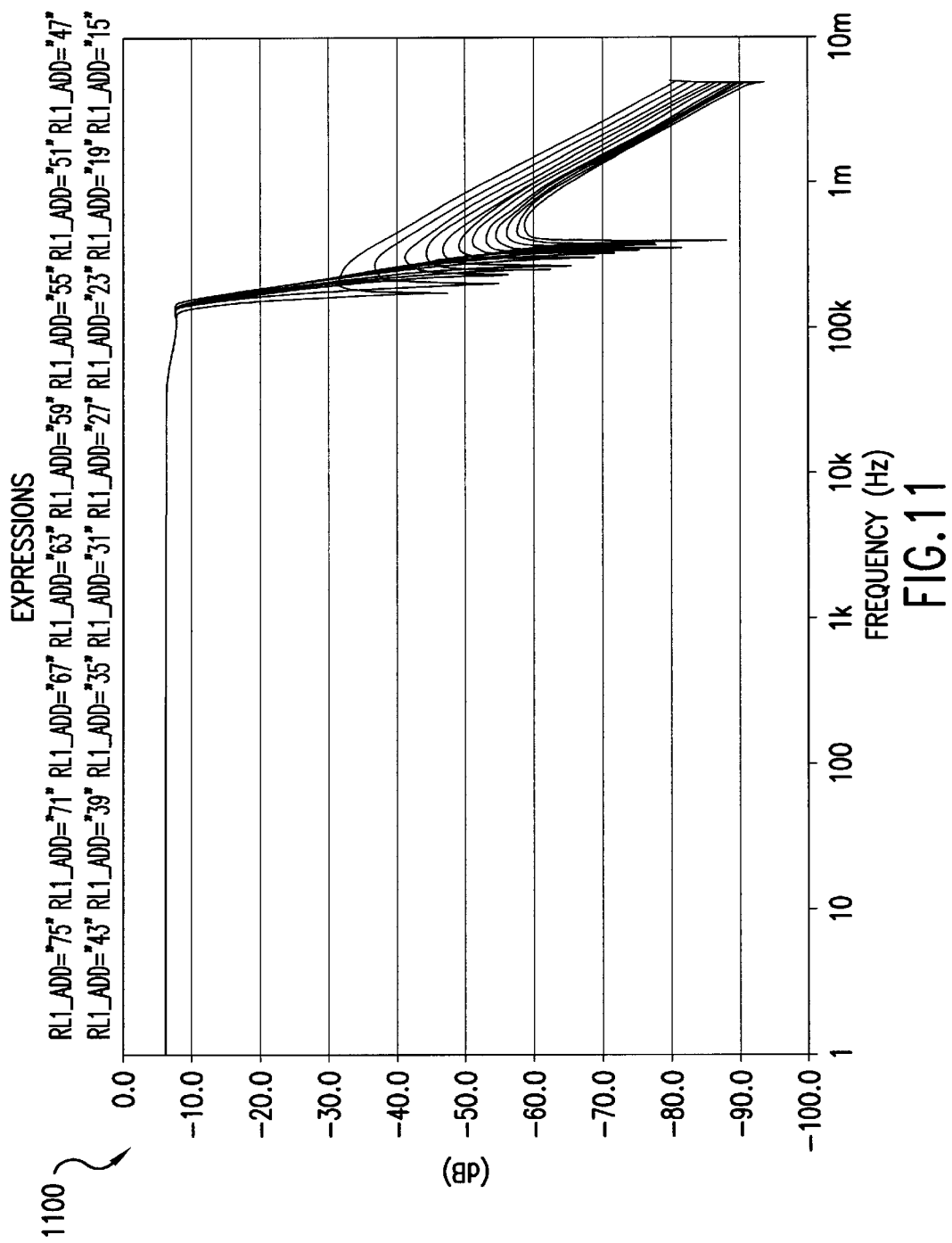

SYSTEM AND METHOD FOR FILTER TUNING

CROSS-REFERENCE TO RELATED APPLICATION

The present application claims the benefit of U.S. provisional patent application, issued Ser. No. 60/206,165, and filed May 22, 2000, which is hereby incorporated by reference in its entirety.

FIELD OF THE INVENTION

The present invention generally relates communications systems wherein signal information is processed both in digital and analog forms. More specifically, the invention relates to the tuning and adjustment of frequency-selective filters that have finite transmission zeros.

BACKGROUND OF THE INVENTION

In communications systems, the need for frequency-selective filtering of analog signals frequently arises. In this regard, a receive filter is an example of a frequency-selective filter of analog signals in a communications system. A receive filter operates to remove signals with frequencies outside of a determined frequency range so that only a desired signal (i.e., the "receive signal") is received by a receiver. The signals that are removed by the receive filter have frequencies that are, depending on the filter type (e.g., low-pass or high-pass), above or below a determined cut-off frequency ("cutoff").

A transmit filter is another example of a frequency-selective filter of analog signals in a communications system. A transmit filter operates to ensure that a transmitter only transmits signals in the frequency range allotted to the transmitter (i.e., the "transmit signal") by removing other, spurious signals that may be introduced into the transmit signal, for example, due to typical imperfections in the transmitter circuitry. These removed signals also have frequencies that are above or below a cutoff frequency.

Frequency-selective filters can be implemented in many ways, as is known in the art. For example, such filters may be implemented using components such as resistors, capacitors, inductors, transconductances, or controlled (i.e., dependent) sources. Although the following description of the present state and needs in the art mainly discusses an integrated circuit (IC) implementation of frequency-selective filters, it should be understood that the description also applies to any other frequency-selective filter implementations, for example, gm-C (transconductance-C), gyrator-based, MOS-R (metal-oxide semiconductor-R), etc.

As is known in the art, frequency-selective filters perform a filtering function, for example as described above, in a signal processing system such as a communications system transmitter. In this regard, filters should meet, among other requirements, three accuracy-related requirements concerning the filter cutoff. These three requirements are: 1) the general nominal cutoff frequency; 2) the accuracy with which the general nominal cutoff is achieved; and 3) the accuracy with which the cutoff is maintained over time and temperature variations. Further, the strictness of these requirements is dependent on the system that the filter is used in.

In regard to the first requirement, i.e. the general nominal cutoff, the filter should operate with a cutoff that is sufficiently close (i.e., within an acceptable tolerance range) to the required cutoff for the filter application. In this regard, the need may arise to tune or adjust the filter cutoff depending on the components utilized to implement the filter. For example, if a filter design is implemented utilizing IC resistors and capacitors, the filter cutoff may vary significantly depending on the manufacturing batch of IC components utilized to construct the filter. Typically, the variation will be too significant for the filter to be useable as designed unless it is tuned (i.e., the cutoff is adjusted). Tuning of the filter in this regard, which will be referred to as "initial tuning", is conducted for the purpose of selecting an operating mode of frequency band and correcting the filter performance due to manufacturing tolerances of the IC components. Typically, initial tuning is accomplished by adjusting the filter cutoff based on the observed filter output of known frequency test signals that are transmitted through the filter.

In regard to the second accuracy-related requirements of the filter cutoff, i.e. the accuracy with which the general nominal cutoff is achieved, this requirement concerns the available accuracy for the initial tuning. In order to satisfy the second requirement, the filter should be capable of adjustment during initial tuning that is fine enough to set the cutoff sufficiently close to the general nominal cutoff described above as the first requirement. In this regard, if the filter cutoff variations due to manufacturing tolerances are small, only a narrow tuning range is needed to meet the second requirement. But, if the filter cutoff variations due to manufacturing tolerances are large, such as when the filter is implemented using IC components, a considerably larger tuning range is needed.

In regard to the third requirement, i.e. the accuracy with which the cutoff is maintained over time and temperature variations, this requirement concerns the stability of the frequency cutoff and it is distinct from the initial tuning requirement (i.e., the second requirement). In order to satisfy the third requirement, the filter should be capable of providing sufficient drift compensation. Drift occurs, for example, when one or more components of the filter (e.g., a resistor or capacitor) has a significant temperature coefficient such that a change in the ambient or operating temperature of the component causes a change in its operating characteristic (e.g., an increase/decrease in resistance or capacitance). This operating characteristic change in the filter component causes the filter cutoff to drift, and this resulting drift may be significant enough to interfere with or disrupt the operation of the signal processing system that the filter is integrated in to. Drift compensation provides for the correction of the filter cutoff in response to drift caused by temperature variations or other conditions. In comparison to the adjustment fineness required for initial tuning, the adjustment fineness required for adequate temperature drift compensation is generally much higher. Additionally, adjustment of the filter cutoff while the system is operating may cause significant transients which severely disrupt the system operation. Therefore, the drift compensation provided by the filter must be designed such that the adjustment transients are sufficiently small enough to avoid system operation disruption.

Presently in the art, the implementation of filters that satisfy the three accuracy-related cutoff requirements described above is generally addressed in one of two ways. In the first way, the need for initial tuning and drift compensation is avoided altogether by implementing the filter such that it is highly accurate and drift-stable. As discussed above, the cutoff accuracy and drift performance of a filter are dependent on the type of components used to implement it. Thus, in order to satisfy the three accuracy related requirements in this first manner, the implementation of the filter must be limited to certain types of components, and this restriction may impose cost inflation and overall application limitations for the filter. For example, meeting the requirements in this manner generally restricts the use of IC components in the filter implementation because of the variation issues discussed above that affect the filter cutoff accuracy and drift. Thus, the low cost and high compactness benefits of IC components are unavailable for filter implementation in this manner.

In the second way of addressing the cutoff accuracy requirements, the system that the filters operates in is designed such that the filter cutoff accuracy requirements are loose enough to accommodate the particular filter implementation. For example, if a filter is implemented in the system using IC components, the filter cutoff accuracy requirements of the system are made relatively loose to accommodate the variation issues discussed above that affect the filter cutoff accuracy and drift. Addressing the cutoff accuracy requirements in this manner may impose cost inflation and application limitations for the entire system that the filter is integrated in to.

There are many situations where addressing the filter cutoff accuracy requirements by either of the present methods described above is undesirable or unfeasible. Therefore, there is a need for a system and method that addresses the following cutoff accuracy requirements of frequency-selective filters: 1) the general nominal cutoff frequency; 2) the accuracy with which the general nominal cutoff is achieved; and 3) the accuracy with which the cutoff is maintained over time and temperature variations. Further, there is a need for such a system and method to address these requirements without imposing undesirable or unfeasible limitations on the type of components used in a filter implementation or on the design of the system that the filter is used in. Even further, there is a need for such a system and method that addresses these requirements without causing disturbances that interfere with or disrupt the operation of the signal processing system that the filter is integrated within.

SUMMARY OF THE INVENTION

Certain objects, advantages, and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve various objects and advantages, the present invention is directed to a novel system and method for filter tuning. In accordance with a preferred embodiment of the present invention, a system for filter tuning is provided that includes means for adjusting the components of a filter by coarse adjustments such that the filter is set with an initial cutoff frequency of adequate accuracy to satisfy the requirements of the filter application, and means for adjusting the components of the filter by fine adjustments such that the filter is set to maintain the accuracy of the initial cutoff frequency in response to cutoff frequency drift.

In accordance with another preferred embodiment of the present invention, a method for filter tuning is provided that includes the steps of adjusting the components of a filter by coarse adjustments such that the filter is set with an initial cutoff frequency of adequate accuracy to satisfy the requirements of the filter application, and adjusting the components of the filter by fine adjustments such that the filter is set to maintain the accuracy of the initial cutoff frequency in response to cutoff frequency drift.

One advantage of a preferred embodiment of the present invention is that it addresses cutoff accuracy requirements of frequency-selective filters, including: 1) the general nominal cutoff frequency; 2) the accuracy with which the general nominal cutoff is achieved; and 3) the accuracy with which the cutoff is maintained over time and temperature variations.

Another advantage of a preferred embodiment of the present invention is that it addresses cutoff accuracy requirements of frequency-selective filters without imposing undesirable or unfeasible limitations on the type of components used in a filter implementation or on the design of the system that the filter is used in.

Yet another advantage of a preferred embodiment of the present invention is that it addresses cutoff accuracy requirements of frequency-selective filters without causing disturbances that interfere with or disrupt the operation of the signal processing system that the filter is integrated within.

Other objects, features, and advantages of the present invention will become apparent to one skilled in the art upon examination of the following drawings and detailed description. It is intended that all such additional objects, features, and advantages be included herein within the scope of the present invention, as defined by the claims.

BRIEF DESCRIPTION OF THE DRAWINGS

The present invention will be more fully understood from the detailed description given below and from the accompanying drawings of a preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

FIG. 11 is a graph of a family of transfer functions that may be obtained by tuning the filter of FIG. 8 using the methods depicted in FIGS. 1–3.

DETAILED DESCRIPTION OF THE PREFERRED EMBODIMENTS

Figure 1:
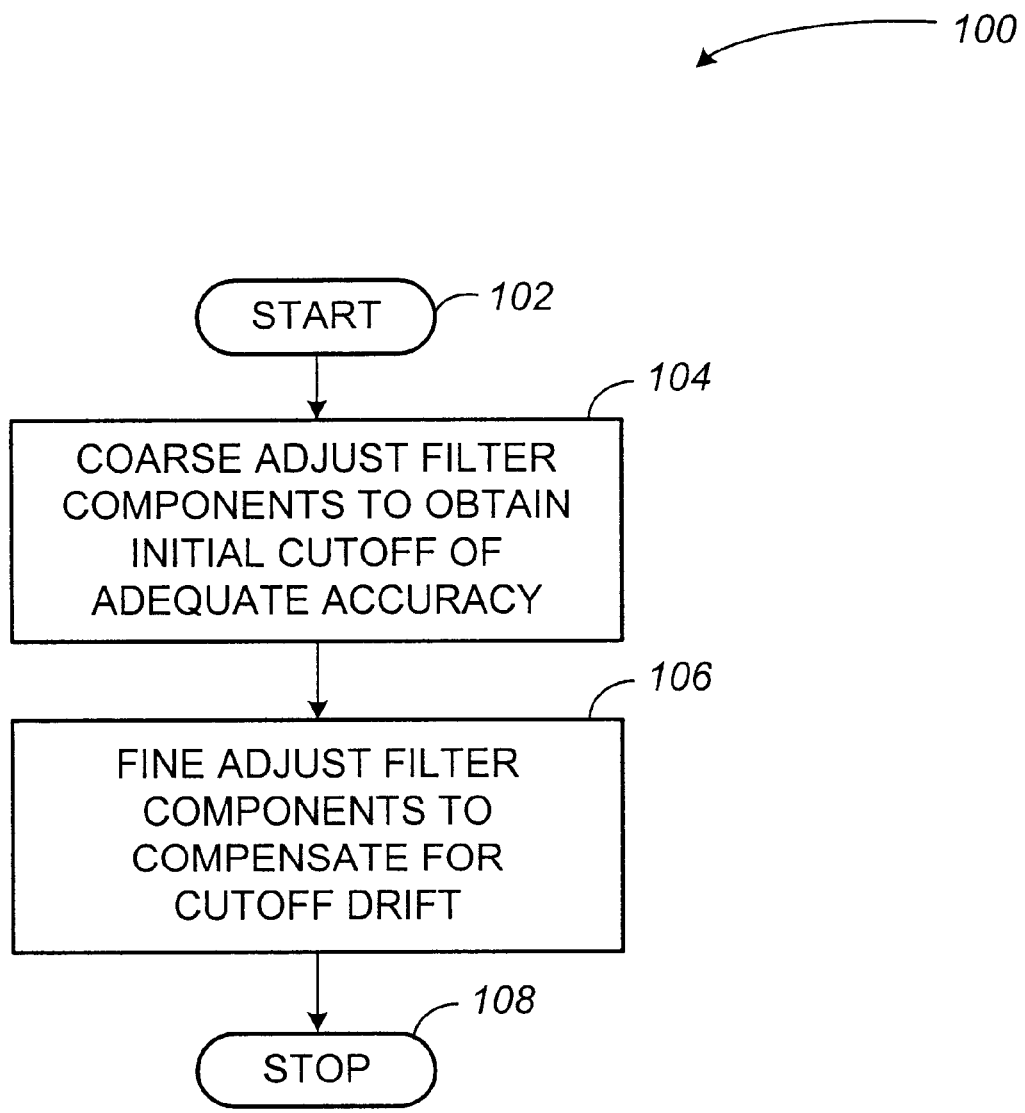
FIG. 1 is a flowchart diagram of a method for tuning frequency-selective filters in accordance with a preferred embodiment of the present invention.

Having summarized the invention above, reference is now made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the spirit and scope of the invention as defined by the appended claims. Indeed, the present invention is believed to be applicable to a variety of systems, devices, and technologies.

Turning now to the drawings, wherein like referenced numerals designate corresponding parts throughout the drawings, FIG. 1 shows a flowchart diagram of a method 100 for tuning frequency-selective filters in accordance with a preferred embodiment of the present invention. This method 100 as well as other embodiments of the present invention, described below, is mainly applicable to frequency selective filters that are characterized by a transfer function with finite transmission zeros, also known in the art as "notches." Cauer (i.e., elliptic) or inverse Chebyshev filters are examples of standard frequency-selective filter functions with notches, but the present invention may be applied to at least any filter that has notches.

In regard to FIG. 1, the filter tuning method 100 begins at a start step 102 and ends at a stop step 108. The method 100 has two substantive steps 104, 106, and these steps may be repeated indefinitely depending on the particular filter tuning application that the method 100 is employed in. Step 104 follows the start step 102 and includes a coarse adjustment of a filter to obtain an initial cutoff that is of adequate accuracy. The coarse adjustment of step 104 is made to those components of the filter (e.g., resistors, capacitors, etc.) that are responsible for the setting of the pole frequencies and pole zeroes of the filter frequency response. These components may be determined, for example, by comparing the transfer function of the filter being tuned with the various polynomial coefficients of a prototype filter. The type of technology used to implement the filter circuit (e.g., IC, gm-C, gyrator-based, MOS-R, etc.) and the type of components which are readily adjustable in the filter circuit are also considered in determining the filter components to adjust for the coarse adjustment in step 104. Other methods known in the art may also be employed to determine the filter components to adjust for the coarse adjustment in step 104.

Actual adjustment of the filter components during the coarse adjustment of step 104 depends on the type of technology used to implement the filter circuit. For example, in a gyrator-based filter circuit implementation, a resistor implemented as a polysilicon resistor string or as a MOSFET is typically adjusted by varying the operation of the resistor within the ohmic region. As another example, in a gyrator-based filter implementation, a capacitor is typically adjusted by adding or removing capacitive branches. Other methods of adjusting filter circuit components that are known in the art are also applicable.

In making the coarse adjustment to obtain an initial filter cutoff of adequate accuracy in step 104, the determination of adequate accuracy depends on the filter application. For example, as is known in the art, many communications systems consist of band-splitting filters and ant-aliasing filters, as well. Typically, the adequate accuracy requirement of the band-splitting filters and anti-aliasing filters is determined respectively based on the type of communications system involved and the sampling rates that are implemented. The adequate accuracy of the filter may be verified by methods that are known in the art, for example a master-slave tuning concept. The master-salve tuning concept is typically applicable in filter implementations where the filter can not be easily tested without disturbing the functionality of the filter (e.g., when the filter is processing signals in a data-mode). Another example of a method to verify the adequate accuracy setting of the filter obtained in step 104 is to measure the filter response in real-time or off-line, compare the response to that of a reference (i.e., master) circuit, and then use a master-slave tuning concept to complete the verification of the filter tuning accuracy.

Step 106 of the filter tuning method 100 follows step 104 and precedes the stop step 108. The step 106 includes fine adjusting the filter components to vary the filter cutoff to compensate for cutoff drift due to temperature changes in the circuit components or the ambient circuit environment. In this regard, fine adjustment is made to the filter components that affect the notch frequency of the filter. These components may be determined by comparing the transfer function of the filter being tuned with the various polynomial coefficients of a prototype filter. The type of technology used to implement the filter circuit (e.g., IC, gm-C, gyrator-based, MOS-R, etc.) and the type of components which are readily adjustable in the filter circuit are also considered in determining the components to adjust for the fine adjustment in step 106. Other methods known in the art may also be employed to determine the filter components to adjust for the fine adjustment in step 106.

Substantially fewer components are adjusted in the fine adjustment of step 106, and the accuracy of the adjustment is much higher (i.e., much finer) than in the coarse adjustment of step 104. This is because step 106 is implemented while the filter is in the operation of processing useful signals (i.e., data-mode), and any adjustment of filter components while the filter is in data-mode should be minimal to avoid disturbances or disruption to the filter operation due to adjustment transients.

In the making the fine adjustment of filter components in step 106, drift of the filter cutoff may be monitored by any of the popular techniques that are known in the art. For example, as implemented in another preferred embodiment of the present invention, filter drift may be monitored based on the temperature change of filter circuit components or the ambient circuit environment. As another example, an independent temperature measuring device (e.g., a specialized thermometer) may be implemented to monitor the temperature change of filter circuit components or the ambient circuit environment, and the measurements of this device may be translated into filter circuit component adjustments.

Figure 2:
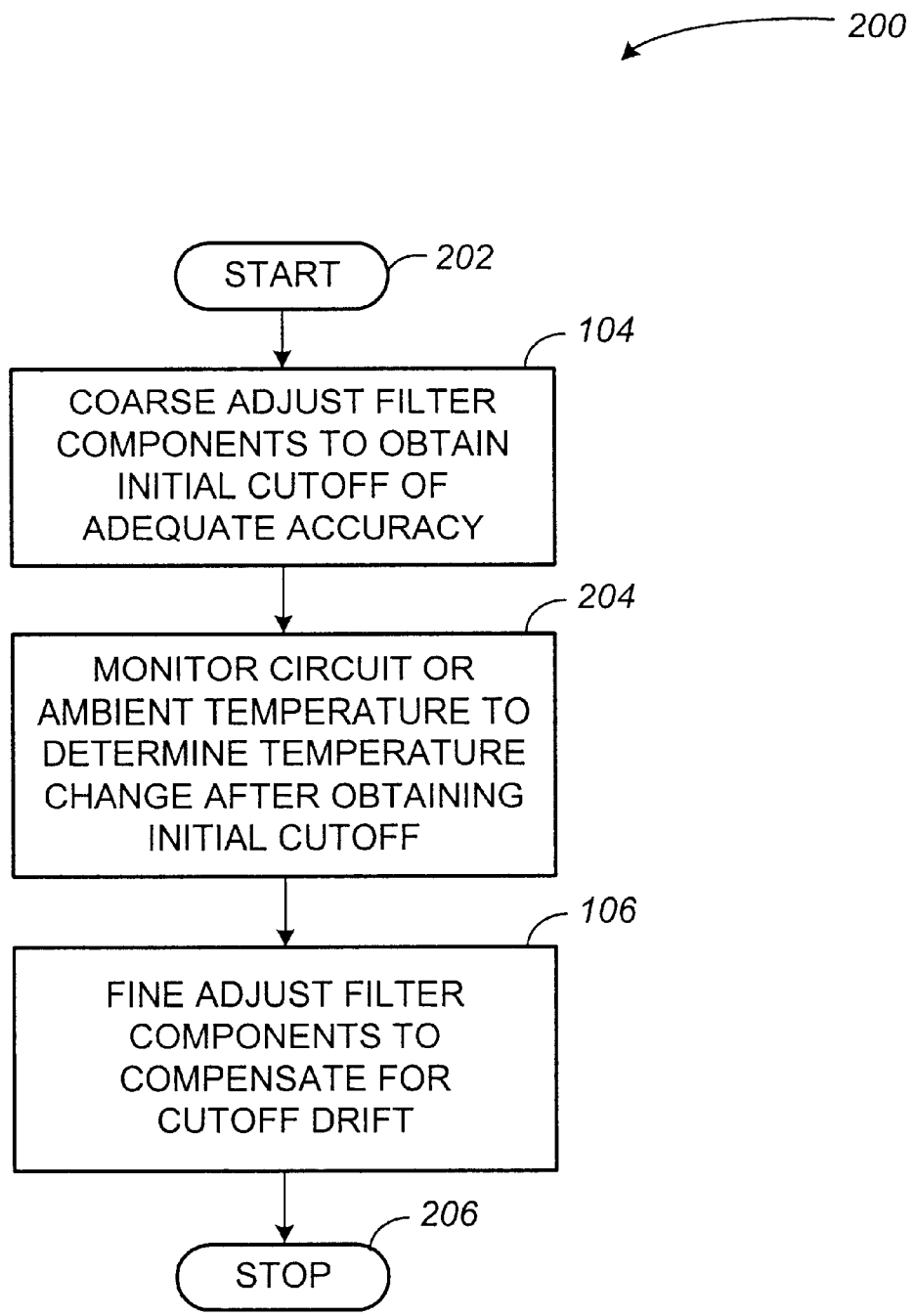
FIG. 2 is a flowchart diagram of a method for tuning frequency-selective filters in accordance with a preferred embodiment of the present invention.

Reference is now directed to FIG. 2 which shows a flowchart diagram of a method 200 for tuning frequency-selective filters in accordance with a preferred embodiment of the present invention. Similar to the tuning method 100, the filter tuning method 200 begins at a start step 202 and ends at a stop step 206. The method 200 has three substantive steps 104, 204, 106 and these steps may be repeated indefinitely depending on the particular filter tuning application that the method 200 is employed in. Step 104 follows the start step 202 and includes a coarse adjustment of a filter to obtain an initial cutoff that is of adequate accuracy. This step 104 of FIG. 2 is substantially the same as the step 104 described above in reference to FIG. 1.

Step 204 in the flowchart diagram of FIG. 2 follows step 104 and includes monitoring the filter cutoff drift by monitoring the temperature change of filter circuit components or the ambient circuit environment to determine the temperature change after the initial cutoff is obtained. As is known in the art, the behavior of filter components such as resistors, capacitors, and MOS-transistors is temperature dependent, particularly when these components are implemented in IC technology. Further, as known in the art, empirical data on the temperature dependency of such filter components can be used to monitor the temperature of the components or the ambient circuit environment. For example, in an IC filter implementation, a temperature independent voltage source configured to place a voltage across an on-chip resistor may be used to monitor the temperature dependent current variation through a resistor in the filter circuit. This variation may then be compared to a reference current to determine the temperature change of the filter circuit component or the ambient filter environment. As another example of a method to monitor and determine the temperature change of filter circuit components or the ambient filter environment, the variation of the oscillation frequency of an on-chip oscillator in comparison to a reference oscillator may be monitored. This monitoring can be accomplished, for example, by counting and comparing the number of cycles of each oscillator within a predefined time period. The difference in terms of the number of cycles represents a direct measure of the temperature change since the temperature coefficient of an oscillator is dependent on the temperature coefficient of the oscillator components, which are typically resistors and capacitors.

Step 106 of the filter tuning method 200 follows step 204 and precedes the stop step 206. The step 106 includes fine adjusting the filter components to vary the filter cutoff to compensate for cutoff drift due to temperature changes in the circuit components or the ambient circuit environment. This step 106 of FIG. 2 is substantially the same as the step 106 described above in reference to FIG. 1. Furthermore, logic implemented, for example, by a controller or digital signal processor (DSP) may be used to calculate the fine adjustment of the appropriate filter components based on the temperature change data determined in step 204.

Figure 3:
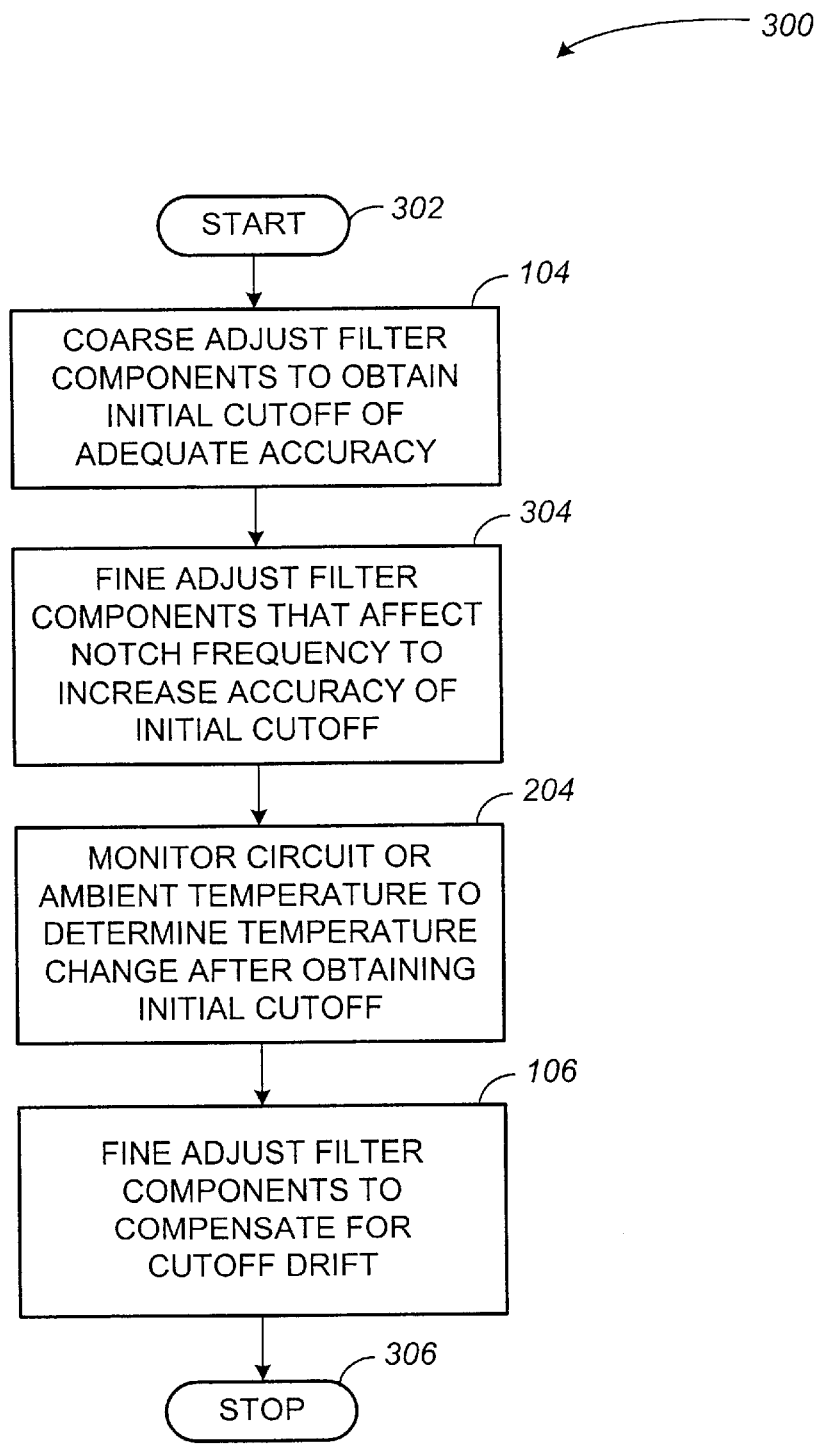
FIG. 3 is a flowchart diagram of a method for tuning frequency-selective filters in accordance with a preferred embodiment of the present invention.

Reference is now directed to FIG. 3 which shows a flowchart diagram of a method 300 for tuning frequency-selective filters in accordance with a preferred embodiment of the present invention. Similar to the tuning method 200, the filter tuning method 300 begins at a start step 302 and ends at a stop step 306. The method 300 has four substantive steps 104, 304, 204, 106 and these steps may be repeated indefinitely depending on the particular filter tuning application that the method 300 is employed in. Step 104 follows the start step 302 and includes a coarse adjustment of a filter to obtain an initial cutoff that is of adequate accuracy. This step 104 of FIG. 3 is substantially the same as the step 104 described above in reference to FIG. 1.

Step 304 follows step 104 in the flowchart diagram of FIG. 3 and includes fine adjusting filter circuit components that affect the notch frequency of the filter in order to increase the accuracy of the initial filter cutoff that is set in step 104. The components adjusted in step 304 may be determined by comparing the transfer function of the filter being tuned with the various polynomial coefficients of a prototype filter. The type of technology used to implement the filter circuit and the type of components which are readily adjustable in the filter circuit are also considered in determining the components to adjust for the fine adjustment in step 304. Other methods known in the art may also be employed to determine the filter components to adjust for the fine adjustment in step 304. Substantially fewer components are adjusted in the fine adjustment of step 304, and the accuracy of the adjustment is much finer than in the coarse adjustment of step 104.

Following step 304 is step 204 in which the filter cutoff drift is monitored by monitoring the temperature change of filter circuit components or the ambient circuit environment to determine the temperature change after the initial cutoff is obtained. This step 204 of FIG. 3 is substantially the same as the step 204 described above in reference to FIG. 2. Following step 204 and preceding the stop step 306 is step 106 of the filter tuning method 300. The step 106 includes fine adjusting the filter components to vary the filter cutoff to compensate for cutoff drift due to temperature changes in the circuit components or the ambient circuit environment, and this step is substantially the same as the step 106 described above in reference to FIG. 1.

Figure 4:
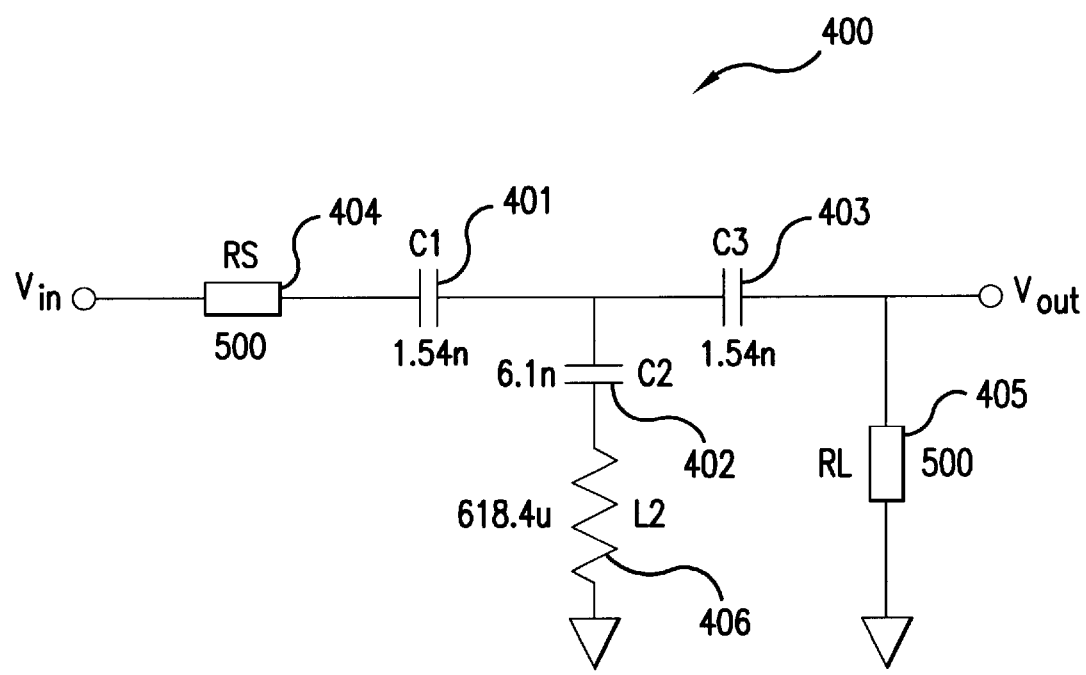
FIG. 4 is a circuit diagram of an LC doubly-terminated ladder highpass filter.

To further facilitate the description of the present invention, a few examples of filter circuits that the tuning methods of the present invention are applicable to are presented. In this regard, reference is now directed to FIG. 4 which shows a circuit diagram of an LC doubly-terminated ladder highpass filter 400. As shown in FIG. 4, the filter 400 includes a configuration of capacitors 401–403, resistors 404–405, and an inductor 406. The filter 400 may be applied in a DSL communications system as a transmit filter at a central office (CO).

Figure 5:
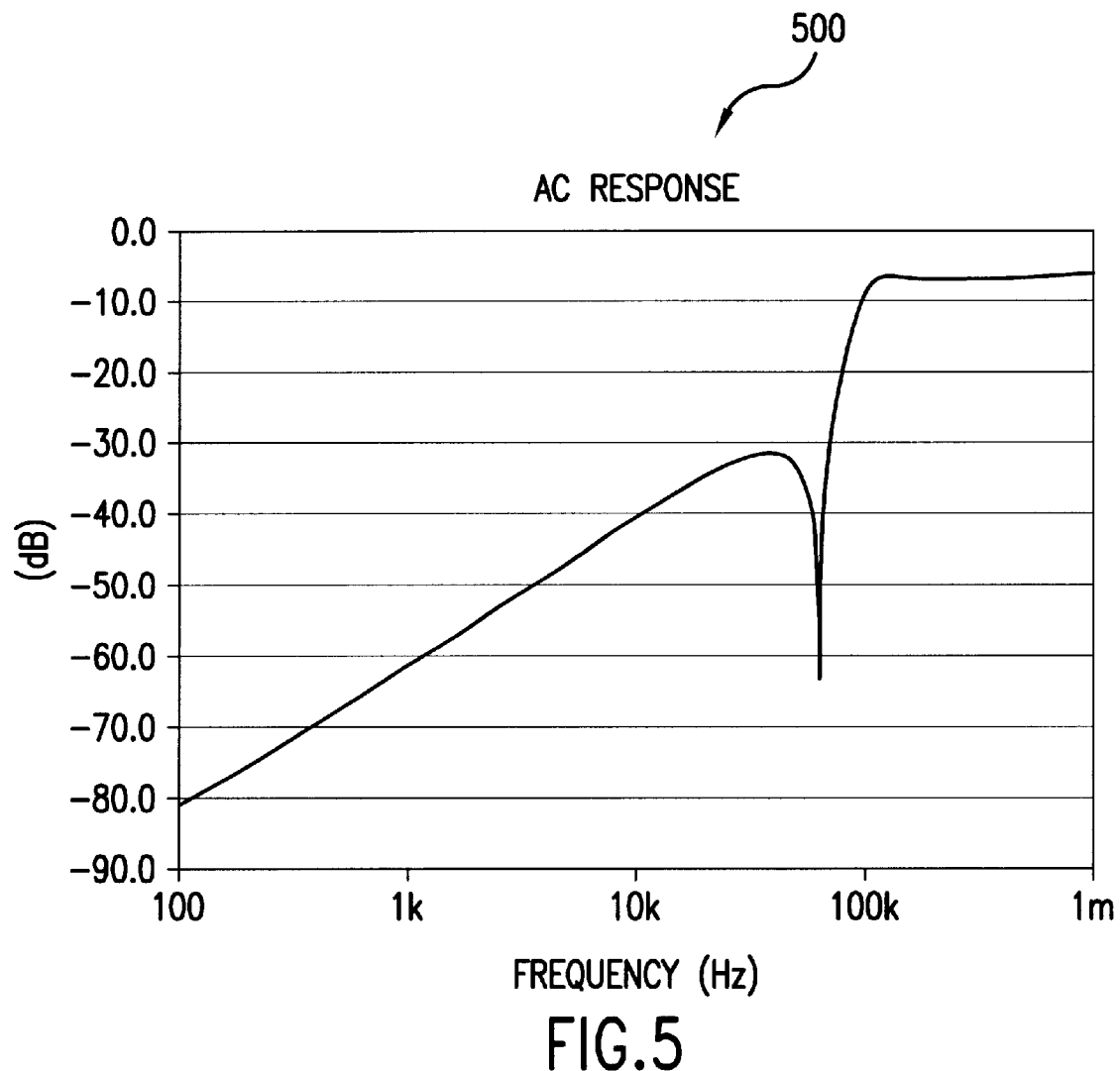
FIG. 5 is a graph of the frequency response of the LC doubly-terminated ladder highpass filter of FIG. 4.

The frequency response 500 of the filter 400 is shown in FIG. 5. It is noted that the frequency response 500 of the filter 400 includes a notch. The notch occurs at approximately 80 kHz for a particular configuration and component sizing of the filter 400 of FIG. 4, but the notch may occur at other frequencies dependent on the sizing of components that affect the notch frequency.

Figure 6:
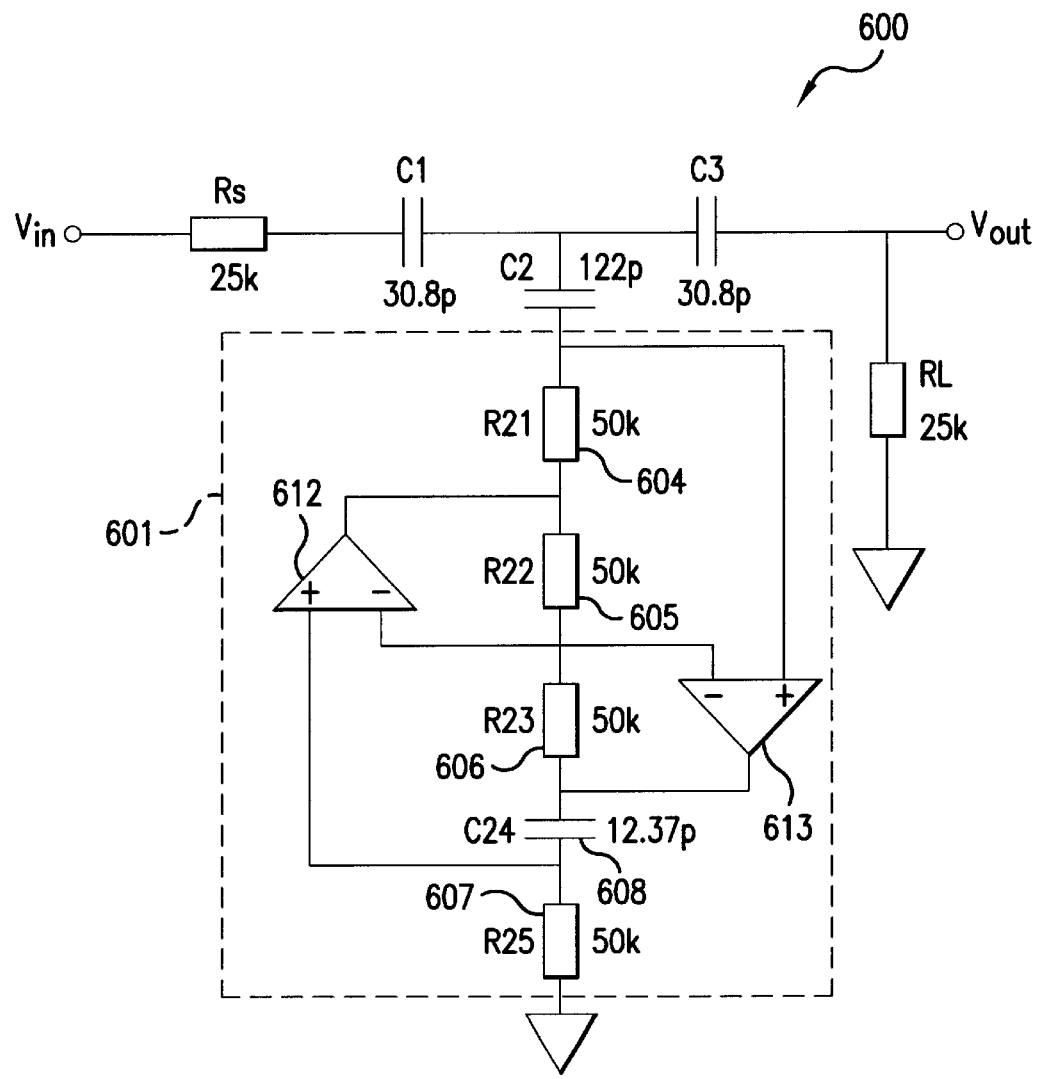
FIG. 6 is a circuit diagram of a doubly-terminated ladder highpass filter implementing a gyrator circuit in lieu of an inductor.

For the filter circuit 400 of FIG. 4 to be implemented in IC technology, an inductor 406 of sufficient sizing is typically impractical to implement. Thus, the inductor 406 may be implemented by an alternate circuit that emulates the functionality of the inductor 406 using op-amp circuits. In this regard, reference is directed to FIG. 6 which shows a circuit diagram of a doubly-terminated ladder highpass filter 600 implementing a "gyrator" circuit 601 in replacement of an inductor. As shown, the gyrator circuit includes a configuration of resistors 604–607, op-amps 612–613, and a capacitor 608. The filter 600 can be practically implemented on-chip in IC technology due to the implementation of the gyrator circuit 601 in lieu of an inductor. Furthermore, the filter 600 can produce the same frequency response 500 of FIG. 5 as the filter 400 of FIG. 4.

Figure 7:
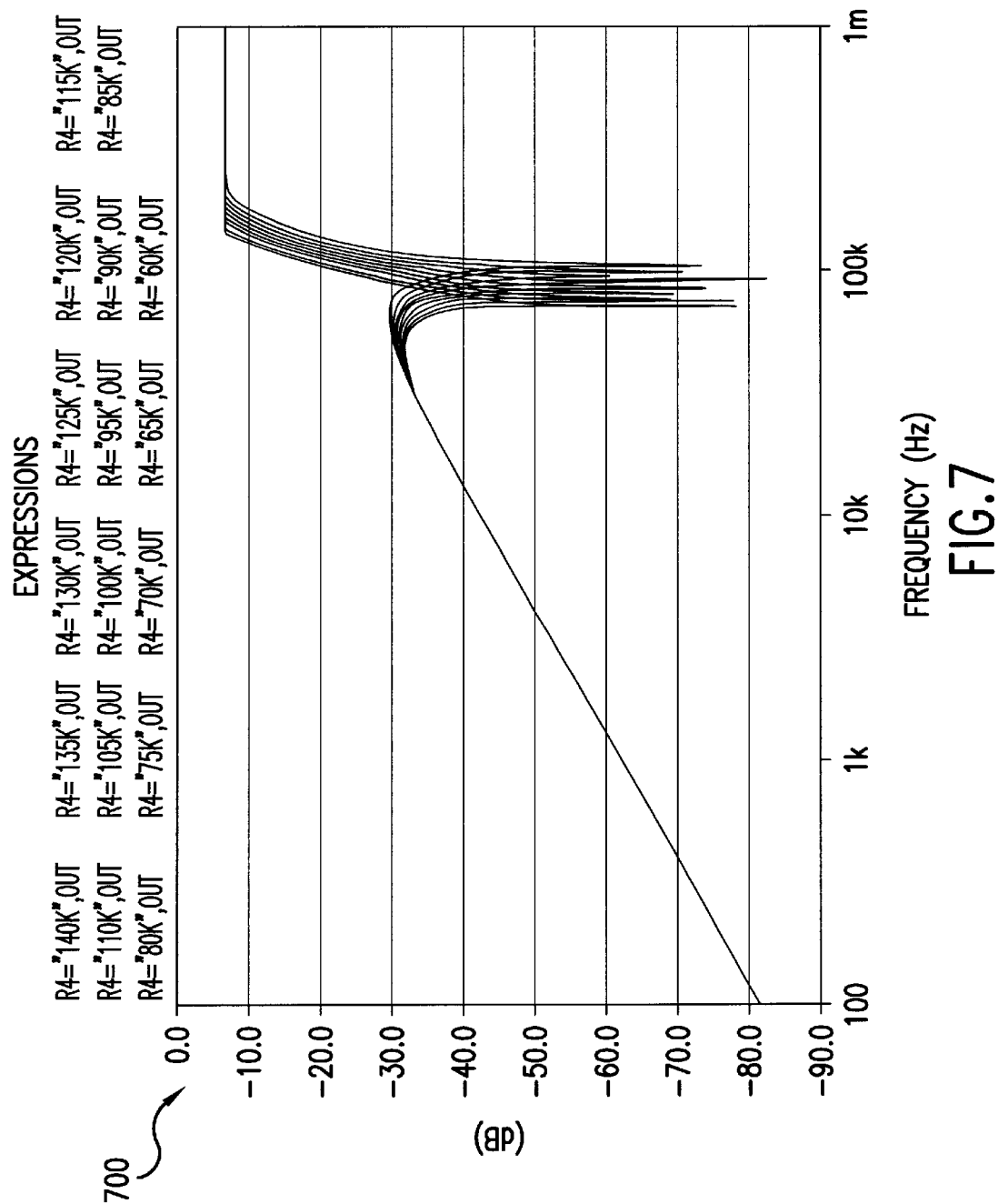
FIG. 7 is a graph of a family of transfer functions that may be obtained by tuning the filter of FIG. 4 using the methods depicted in FIGS. 1–3.

The filter 400 of FIG. 4 can be tuned using the methods 100, 200, or 300 described above. In this regard, FIG. 7 shows a family of transfer functions 700 that may be obtained by tuning the filter 400 using the methods 100, 200, or 300. Specifically, in this particular application, adjusting the size of the inductor 406 results in the filter 400 displaying the transfer functions 700 shown in FIG. 7. It is noted that in the transfer functions 700, the notch frequency varies, and thus the cutoff varies, but the passband characteristic is substantially maintained.

As described above, the filter 400 may be tuned using the methods 100, 200 or 300 by adjusting the inductor 406. But, it is typically impractical to adjust a physical inductor, and as discussed above, it is also impractical to implement an inductor in an IC circuit. Thus, the gyrator filter 600 may be implemented in place of the inductor filter 400, as discussed above. In this regard, the transfer functions 700 may also be obtained by applying the methods 100, 200, or 300 to the filter 600. Specifically, the resistor 607 of the filter 600 may be adjusted to obtain the transfer functions 700 shown in FIG. 7.

Figure 8:
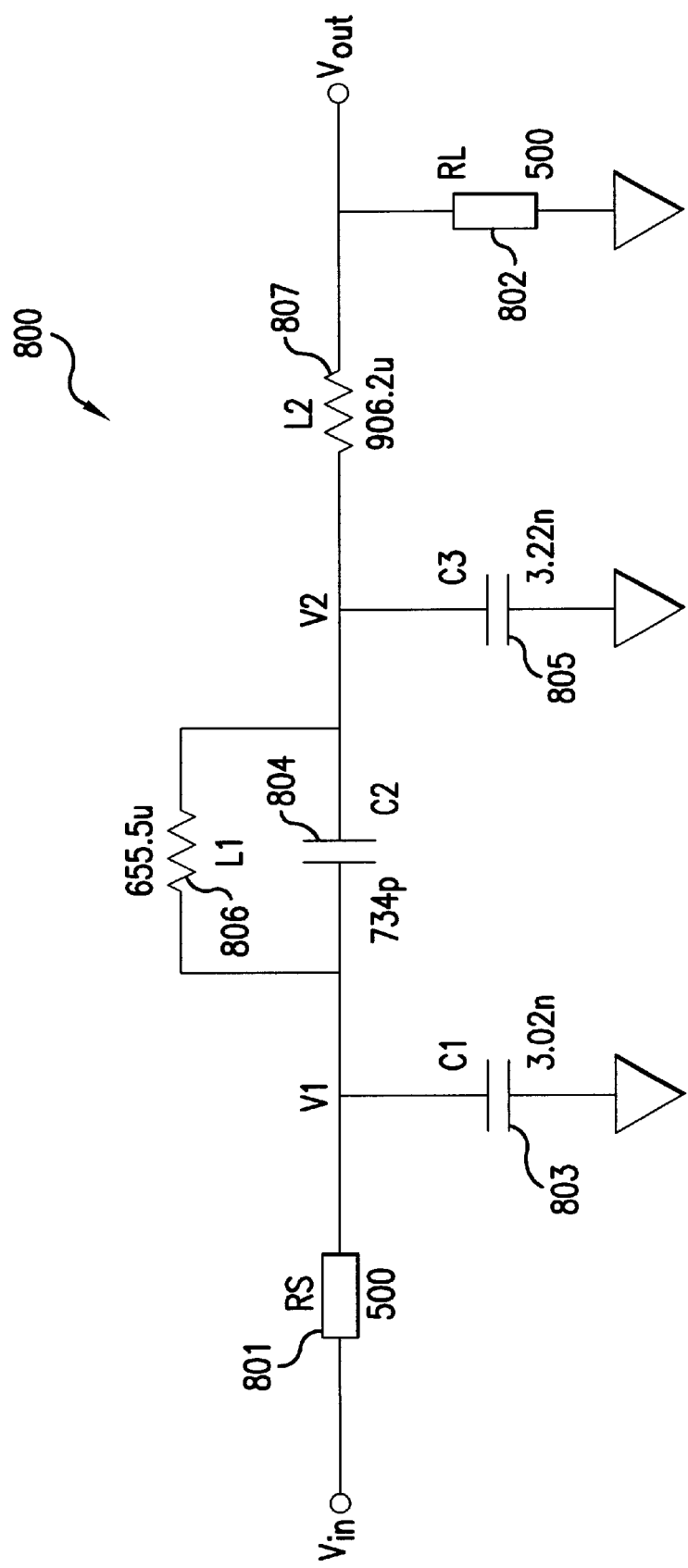
FIG. 8 is a circuit diagram of an LC lowpass filter.

Attention is now directed to FIG. 8 which shows a circuit diagram of an LC lowpass filter 800. As shown in FIG. 8, the filter 800 includes a configuration of resistors 801–802, capacitors 803–805, and inductors 806–807. The filter 800 may be applied in a DSL communications system as a transmit filter at a customer premise (CP).

For the filter circuit 800 of FIG. 8 to be implemented in IC technology, inductors 806–807 of sufficient sizing are impractical to implement. One way of alternatively implementing the filter 800 without the inductors 806–807 is to first describe the voltages and current flow in the filter 800 using a signal flow graph ("SFG"). In this regard, reference is directed to FIG. 9 which shows an SFG 900 for the filter circuit 800 of FIG. 8. The current and voltage relations in the SFG 900 can be emulated in a filter circuit comprising resistors, capacitors, and op-amps.

Figure 9:
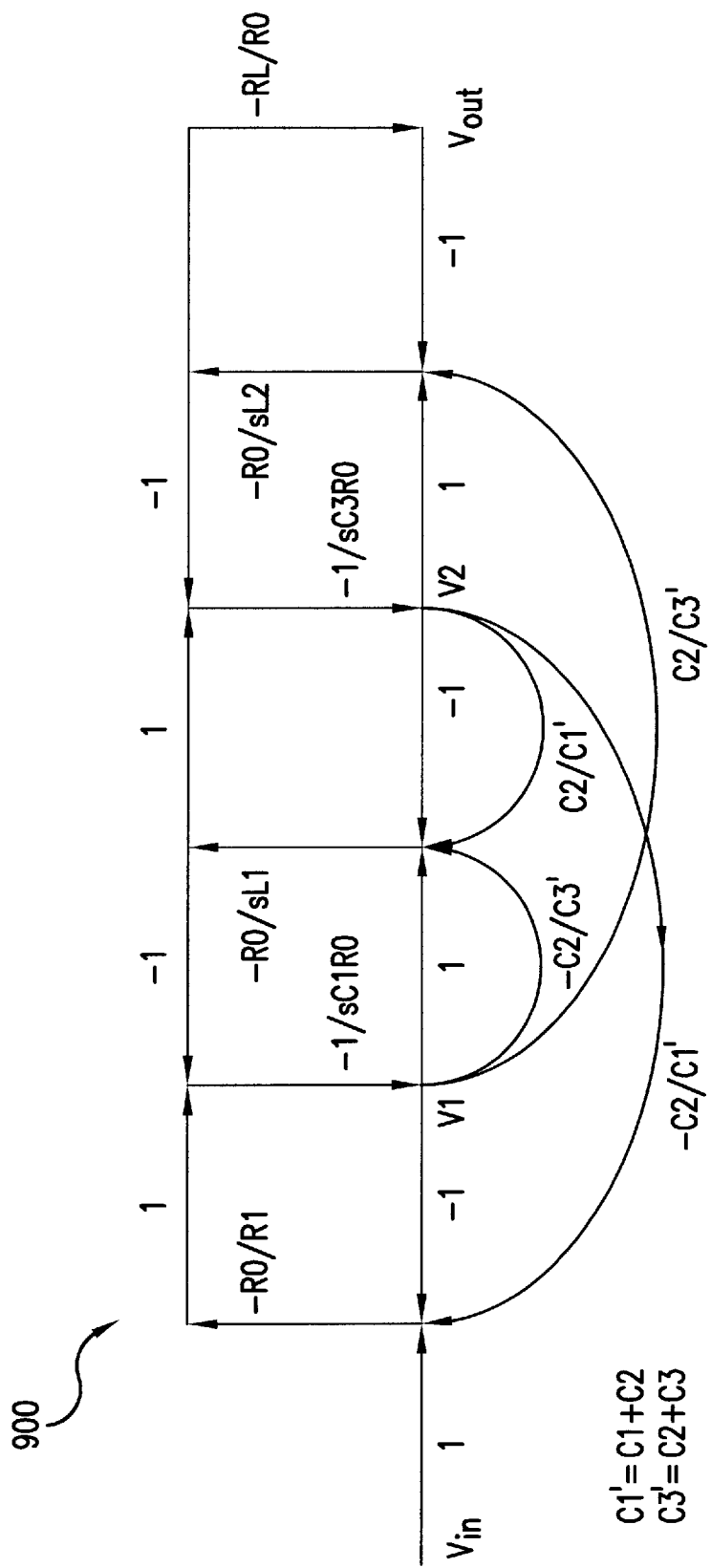
FIG. 9 is a signal flow graph that describes the voltages and current flow in the filter circuit of FIG. 8.
Figure 10:
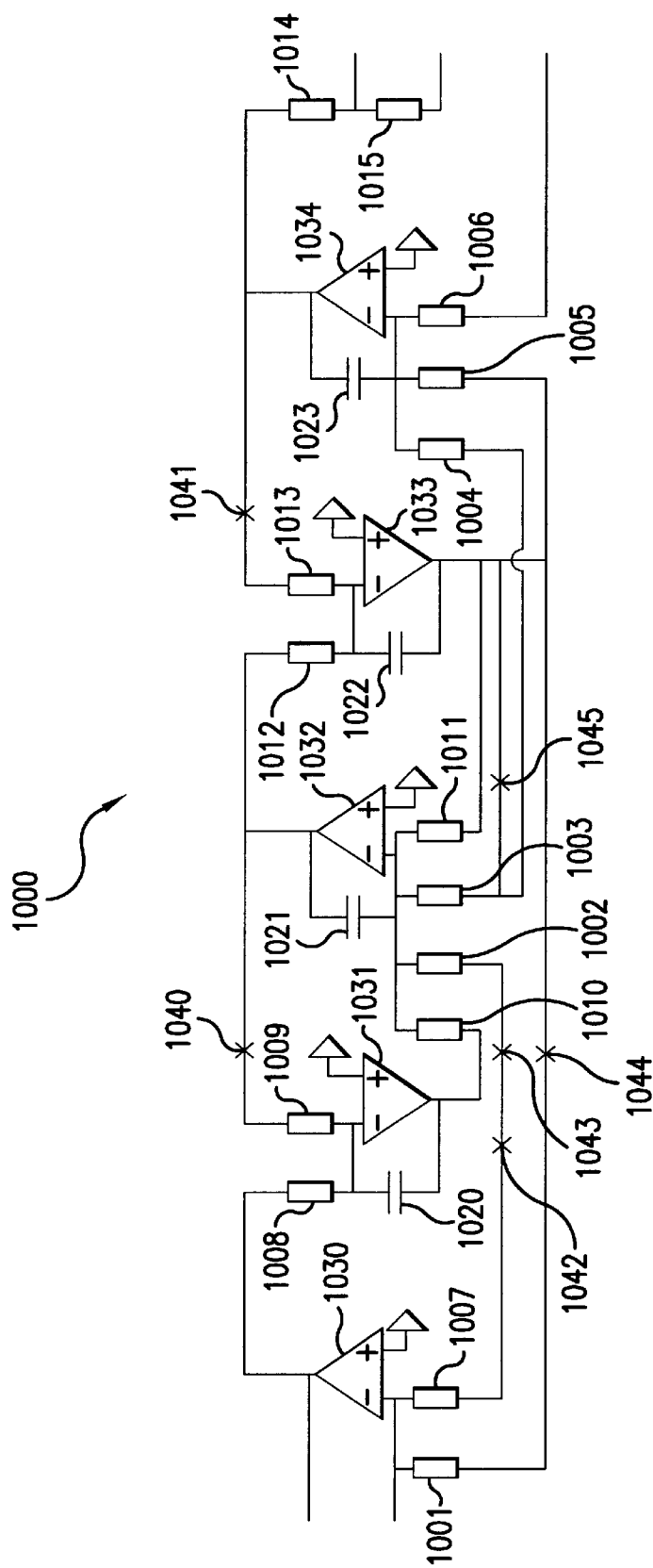
FIG. 10 is a lowpass filter circuit that emulates the signal flow graph of FIG. 9 using resistors, capacitors, and op-amps.

In this regard, reference is directed to FIG. 10 which shows a lowpass filter circuit 1000 that emulates the SFG 900 of FIG. 9. The filter 1000 includes a configuration of resistors 1001–1015, capacitors 1020–1023, and op-amps 1030–1034. The filter circuit 1000 is depicted in FIG. 10 as one half of a differential and balanced circuit. Signal inversion points 1040–1045 are accomplished by taking the signal from the other half of the circuit (not shown). Furthermore, values of the resistors 1001–1015 and capacitors 1020–1023 may be deduced from the LC lowpass filter 800 (FIG. 8) and the SFG 900 (FIG. 9). The filter 1000 can be practically implemented on-chip in IC technology since it is implemented without inductors. Furthermore, the filter 1000 can produce the same frequency response (not shown) as the LC lowpass filter 800 of FIG. 8.

The filter 800 of FIG. 8 can be tuned using the methods 100, 200, or 300 described above. In this regard, FIG. 11 shows a family of transfer functions 1100 that may be obtained by tuning the filter 800 using the methods 100, 200, or 300. Specifically, in this particular application, adjusting the size of the capacitor 804 results in the filter 800 displaying the transfer functions 1100 shown in FIG. 11. It is noted that in the transfer functions 1100, the notch frequency varies, and thus the cutoff varies, but the passband characteristic is substantially maintained.

As described above, the filter 800 may be tuned using the methods 100, 200 or 300 by adjusting the capacitor 804. But, the implementation of a variable capacitor is typically impractical and inconvenient. Furthermore, the inductors 806–807 are also typically impractical to implement on-chip. Thus, the alternate filter circuit 1000 may be implemented in place of the LC filter 800, as discussed above. In this regard, the transfer functions 1100 may also be obtained by applying the methods 100, 200, or 300 to the filter 1000. Specifically, resistors 1001–1004 of the filter 1000 may be adjusted to obtain the transfer functions 1100 shown in FIG. 8.

The flowchart diagrams of the filter tuning methods 100, 200, and 300 described above and shown in FIGS. 1, 2, and 3 of the present invention show the architecture, functionality, and operation of possible implementations of the present invention. In this regard, each block may represent a module, segment, or portion of code, which comprises one or more executable instructions for implementing the specified logical function(s). It should also be noted that in some alternative implementations, the functions noted in the blocks may occur out of the order shown.

It is emphasized that the above-described embodiments of the present invention, particularly any "preferred" embodiments, are merely possible examples of the implementations that are merely set forth for a clear understanding of the principles of the invention. It will be apparent to those skilled in the art that many modifications and variations may be made to the above-disclosed embodiments of the present invention without departing substantially from the spirit and principles of the invention. All such modifications and variations are intended to be included herein within the scope of the disclosure and present invention and protected by the following claims.

Therefore, having thus described the invention, at least the following is claimed:

1. A method for filter tuning, comprising the steps of:
   determining a first group of components of a filter that define pole frequencies and pole zeroes of the frequency response of said filter;
   determining an initial cutoff frequency of adequate accuracy to satisfy requirements of the application of said filter;
   adjusting said first group of components of said filter by coarse adjustments, such that said filter is set with said initial cutoff frequency of adequate accuracy;
   determining a second group of components of said filter that define a notch frequency of said filter;
   determining an initial cutoff frequency of higher accuracy than the adequate accuracy to satisfy requirements of the application of said filter;
   adjusting said second group of components of said filter by fine adjustments, such that said filter is set with said initial cutoff frequency of higher accuracy than the adequate accuracy to satisfy requirements of the application of said filter;
   monitoring a temperature of said filter;
   determining a temperature variation of said filter from the initial temperature of said filter when said filter is set with said initial cutoff frequency of higher accuracy than the adequate accuracy to satisfy requirements of the application of said filter;
   determining a third group of components of said filter that define said notch frequency of said filter to maintain the accuracy of the initial cutoff frequency in response to cutoff frequency drift dependent on said temperature variation of said filter; and
   adjusting said third group of components of said filter by fine adjustments, such that said filter is set to maintain the accuracy of the initial cutoff frequency in response to cutoff frequency drift dependent on said temperature variation of said filter.

2. The method of claim 1, wherein said step of monitoring a temperature of said filter comprises monitoring a temperature of the circuit components of said filter.

3. The method of claim 1, wherein said step of monitoring a temperature of said filter comprises monitoring a temperature of the ambient circuit environment of said filter.

4. A method for filter tuning, comprising the steps of:
   adjusting components of a filter by coarse adjustments, such that said filter is set with an initial cutoff frequency of adequate accuracy to satisfy requirements of the application of said filter;
   adjusting the components of said filter by fine adjustments, such that said filter is set with an initial cutoff frequency of higher accuracy than the adequate accuracy to satisfy requirements of the application of said filter;

monitoring a temperature of said filter;

determining a temperature variation of said filter from the initial temperature of said filter when said filter is set with an initial cutoff frequency; and adjusting the components of said filter by fine adjustments, such that said filter is set to maintain the accuracy of the initial cutoff frequency in response to cutoff frequency drift dependent on said temperature variation of said filter.

5. The method of claim 4, wherein said step of monitoring a temperature of said filter comprises monitoring a temperature of the circuit components of said filter.

6. The method of claim 4, wherein said step of monitoring a temperature of said filter comprises monitoring a temperature of the ambient circuit environment of said filter.

7. A method for filter tuning, comprising the steps of:

adjusting components of a filter by coarse adjustments, such that said filter is set with an initial cutoff frequency of adequate accuracy to satisfy requirements of the application of said filter;

monitoring a temperature of said filter;

determining a temperature variation of said filter from the initial temperature of said filter when said filter is set with an initial cutoff frequency; and adjusting the components of said filter by fine adjustments, such that said filter is set to maintain the accuracy of the initial cutoff frequency in response to cutoff frequency drift dependent on said temperature variation of said filter.

8. The method of claim 7, wherein said step of monitoring a temperature of said filter comprises monitoring a temperature of the circuit components of said filter.

9. The method of claim 7, wherein said step of monitoring a temperature of said filter comprises monitoring a temperature of the ambient circuit environment of said filter.

10. A system for filter tuning, comprising:

means for determining a first group of components of a filter that define pole frequencies and pole zeroes of the frequency response of said filter;

means for determining an initial cutoff frequency of adequate accuracy to satisfy requirements of the application of said filter;

means for adjusting said first group of components of said filter by coarse adjustments, such that said filter is set with said initial cutoff frequency of adequate accuracy;

means for determining a second group of components of said filter that define a notch frequency of said filter;

means for determining an initial cutoff frequency of higher accuracy than the adequate accuracy to satisfy requirements of the application of said filter;

means for adjusting said second group of components of said filter by fine adjustments, such that said filter is set with said initial cutoff frequency of higher accuracy than the adequate accuracy to satisfy requirements of the application of said filter;

means for monitoring a temperature of said filter;

means for determining a temperature variation of said filter from the initial temperature of said filter when said filter is set with said initial cutoff frequency of higher accuracy than the adequate accuracy to satisfy requirements of the application of said filter;

means for determining a third group of components of said filter that define said notch frequency of said filter to maintain the accuracy of the initial cutoff frequency in response to cutoff frequency drift dependent on said temperature variation of said filter; and means for adjusting said third group of components of said filter by fine adjustments, such that said filter is set to maintain the accuracy of the initial cutoff frequency in response to cutoff frequency drift dependent on said temperature variation of said filter.

11. The system of claim 10, wherein said means for monitoring a temperature of said filter comprises means for monitoring a temperature of the circuit components of said filter.

12. The system of claim 10, wherein said means for monitoring a temperature of said filter comprises means for monitoring the ambient circuit environment of said filter.

13. A system for filter tuning, comprising:

means for adjusting components of a filter by coarse adjustments, such that said filter is set with an initial cutoff frequency of adequate accuracy;

means for monitoring a temperature of said filter;

means for determining a temperature variation of said filter from the initial temperature of said filter when said filter is set with said initial cutoff frequency of higher accuracy than the adequate accuracy to satisfy requirements of the application of said filter; and means for adjusting the components of said filter by fine adjustments, such that said filter is set to maintain the accuracy of the initial cutoff frequency in response to cutoff frequency drift dependent on said temperature variation of said filter.

14. The system of claim 13, wherein said means for monitoring a temperature of said filter comprises means for monitoring a temperature of the circuit components of said filter.

15. The system of claim 13, wherein said means for monitoring a temperature of said filter comprises means for monitoring the ambient circuit environment of said filter.

* * * * *